United States Patent
Wu et al.

(10) Patent No.: US 10,396,419 B2
(45) Date of Patent: Aug. 27, 2019

(54) COMMON-MODE SIGNAL ABSORBER

(71) Applicant: NATIONAL TAIWAN UNIVERSITY, Taipei (TW)

(72) Inventors: Tzong-Lin Wu, Taipei (TW); Po-Jui Li, Taipei (TW); Ying-Cheng Tseng, Taipei (TW); Chi-Hsuan Cheng, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 16/240,905

(22) Filed: Jan. 7, 2019

(65) Prior Publication Data

US 2019/0140333 A1      May 9, 2019

Related U.S. Application Data

(63) Continuation of application No. 15/585,507, filed on May 3, 2017, now Pat. No. 10,211,496.

(30) Foreign Application Priority Data

Nov. 4, 2016   (TW) .............................. 105136249 A

(51) Int. Cl.
*H01P 1/20*        (2006.01)
*H03H 1/00*       (2006.01)

(52) U.S. Cl.
CPC ............. *H01P 1/20* (2013.01); *H03H 1/0007* (2013.01)

(58) Field of Classification Search
CPC ................................ H01P 1/20; H03H 1/0007
USPC ....................................... 333/12, 1, 4, 5, 181
See application file for complete search history.

(56) References Cited

U.S. PATENT DOCUMENTS

2015/0214919 A1* 7/2015 Qureshi ................... H03H 7/42
333/5

* cited by examiner

*Primary Examiner* — Stephen E. Jones
(74) *Attorney, Agent, or Firm* — Rosenberg, Klein & Lee

(57) ABSTRACT

The present invention provides a common-mode signal absorber, which comprises an impedance-matching network and a common-mode signal reflection circuit. A differential-mode signal is inputted into input ends of the impedance-matching network, and outputted from output ends of the common-mode signal reflection circuit. When a common-mode signal is inputted into the common-mode signal absorber, the common-mode signal reflection circuit is for reflecting the common-mode signal within a specific frequency band. Afterward, the reflection of the common-mode signal within the specific frequency band will be absorbed by an impedance element of the impedance-matching network. Thus, the common-mode signal within the specific frequency band may be absorbed by the impedance-matching network so as to avoid to interfere signals transmitted on a communication system.

8 Claims, 12 Drawing Sheets

COMMON-MODE SIGNAL ABSORBER

CROSS-REFERENCE TO RELATED APPLICATIONS

This application is a continuation of U.S. patent application Ser. No. 15/585,507, "COMMON-MODE SIGNAL ABSORBER AND EQUIVALENT CIRCUIT THEREOF" filed May 3, 2017, which claims priority claim under 35 U.S.C. § 119(a) on Taiwan Patent Application No. 105136249 filed Nov. 4, 2016, the entire contents of which are incorporated herein by reference.

FIELD OF THE INVENTION

The present invention is related to a signal absorber, particularly to a signal absorber for absorbing the common-mode signal.

BACKGROUND

The advance of technology has driven faster operation speed and clock frequency for digital circuits such that the techniques of differential transmission lines are widely applied in high-speed data transmission applications. The differential transmission lines have the characteristics of low electromagnetic radiation, and low crosstalk, and therefore acted an important role in digital signal transmission. However, in an actual high speed circuit, the circuit for differential transmission lines will often appear some non-ideal circuit structures, for example, a circuit with asymmetrical wiring, bended signal trajectory, and the existence of slots. Those non-ideal circuit structures may adversely convert the differential-mode signals into common-mode noises, which may cause serious electromagnetic interference (EMI), and therefore interference the operation of the radio frequency circuit or the antenna.

To solve the problem of EMI, in the past, it is most common to use an electromagnetic material, for example, common-mode choke (CMC), to achieve the suppression of EMI, in which the feature of high inductance of electromagnetic material is used to suppress the generation of EMI. However, the permeability of the electromagnetic material attenuates quickly in high frequency, in which condition makes the electromagnetic material not suitably in high-speed transmission interface with frequency section of GHz or above.

Later, a common-mode reflection circuit having a defective ground structure or a mushroom structure was proposed successively. The defective ground structure or the mushroom structure constructs a resonant cavity in a symmetry plane of the common-mode reflection circuit to suppress the common-mode signal by using the resonant cavity. Here, the defective ground structure or the mushroom structure of the common-mode reflection circuit is able to effectively suppress the common-mode signal at the high frequency operation of GHz.

The above common-mode reflection circuit is a circuit for reflecting the common-mode signal. When the common-mode reflection circuit is in operation, most of the common-mode signal will be reflected to the front circuit to prevent the common-mode signal to interfere the circuit to be protected. However, the reflected common-mode signal may also be transmitted to other radiating elements, in which the problem of electromagnetic interference still exists in the communication system.

SUMMARY

It is one object of the present invention to provide a common-mode signal absorber, which comprises an impedance-matching network and a common-mode signal reflection circuit, the common-mode signal reflection circuit is for reflecting a common-mode signal with a specific frequency band, the impedance-matching network is for absorbing the common-mode signal with the specific frequency band, so as to avoid the common-mode signal to interfere signals transmitted on a communication system.

It is another object of the present invention to provide a common-mode signal absorber, for the common-mode signal within the specific frequency band, an absolute value of a reflection coefficient for input ends of the common-mode signal reflection circuit is greater than 0.8, an absolute value of a reflection coefficient for input ends of the impedance-matching network is less than 0.4.

It is another object of the present invention to provide a common-mode signal absorber, in which one impedance-matching network is configured on input ends of the common-mode signal reflection circuit, and other impedance-matching network is configured on output ends of the common-mode signal reflection circuit. Thus, the common-mode signal reflection circuit is provided on both ends thereof with the impedance-matching network to achieve the effect of bidirectional absorption of the common-mode signal.

For achieving above objects, the present invention provides a common-mode signal absorber, comprising: a first impedance-matching network comprising a first impedance unit; and a common-mode signal reflection circuit connected to the first impedance-matching network, wherein a differential-mode signal is inputted into the first impedance-matching network, and outputted from the common-mode signal reflection circuit, the common-mode signal reflection circuit is used to reflect a common-mode signal within a specific frequency band when the common-mode signal enters the common-mode signal absorber; wherein the first impedance-matching network is impedance matched to the common-mode signal within the specific frequency band, the first impedance unit of the first impedance-matching network is used to absorb the common-mode signal within the specific frequency band when the common-mode signal within the specific frequency band enters the first impedance-matching network.

In one embodiment of the present invention, for the common-mode signal within the specific frequency band, an absolute value of a reflection coefficient for input ends of the common-mode signal reflection circuit is greater than 0.8, an absolute value of a reflection coefficient for input ends of the first impedance-matching network is less than 0.4.

In one embodiment of the present invention, wherein the common-mode signal absorber has an absorption rate above 50% for the common-mode signal within the specific frequency band.

In one embodiment of the present invention, wherein the common-mode signal absorber further comprises a pair of differential transmission lines, the common-mode signal absorber transmits the differential-mode signal by the pair of differential transmission lines, a circuit structure of the common-mode signal absorber is symmetrically provided on right and left sides of the differential transmission lines based on a center line between the pair of differential transmission lines.

In one embodiment of the present invention, wherein a circuit structure of the common-mode signal absorber comprises: a ground layer, provided on one side thereof with a first slot portion, and provided on other side thereof with a second slot portion, wherein a first impedance unit is configured in the first slot portion, a second impedance unit is configured in the second slot portion, one end of the first impedance unit is connected to the ground layer, one end of the second impedance unit is connected to the ground layer; a first metal pad, configured on the above of the first slot portion, and connected to other end of the first impedance unit by a vertically configured first conductive via; a second metal pad, configured on the above of the second slot portion, and connected to other end of the second impedance unit by a vertically configured second conductive via; and a pair of differential transmission lines comprising a pair of first line segments, a pair of second line segments, and a pair of third line segments, wherein the pair of first line segments are provided at a position that is vertical extension of the first slot portion and the first metal pad, the pair of third line segments are provided at a position that is vertical extension of the second slot portion and the second metal pad, a gap is existed between the pair of first line segments and the first metal pad, and between the pair of third line segments and the second metal pad, respectively, the pair of second line segments are connected between the pair of first line segments and the pair of third line segments, other gap is existed between the pair of second line segments and the ground layer, one ends of the pair of second line segments are connected to one ends of the pair of first line segments by a vertically configured third conductive via, respectively, other ends of the pair of second line segments are connected to one ends of the pair of third line segments by a vertically configured fourth conductive via, respectively; wherein the pair of first line segments, the first metal pad, the first slot portion, the first impedance unit, and parts of the ground layer around the first slot portion will be formed as a first circuit structure, the pair of second line segments and parts of the ground layer below the pair of second line segments will be formed as a second circuit structure, the pair of third line segments, the second metal pad, the second slot portion, the second impedance unit, and parts of the ground layer around the second slot portion will be formed as a third circuit structure, the first impedance-matching network comprises the first circuit structure and the second circuit structure, the common-mode signal reflection circuit comprises the third circuit structure.

In one embodiment of the present invention, wherein the pair of first line segments, the pair of second line segments, or the pair of third line segments are a pair of symmetrical line segments.

In one embodiment of the present invention, wherein the common-mode signal absorber further comprises a second impedance-matching network, the second impedance-matching network is connected to the common-mode signal reflection circuit, the differential-mode signal is inputted into the first impedance-matching network, passed through the common-mode signal reflection circuit, and outputted from the second impedance-matching network, the second impedance-matching network comprises a second impedance unit, the second impedance-matching network is impedance matched to the common-mode signal within the specific frequency band, the second impedance unit of the second impedance-matching network is used to absorb the common-mode signal within the specific frequency band when the common-mode signal within the specific frequency band enters the second impedance-matching network.

In one embodiment of the present invention, wherein when the common-mode signal absorber is operated in a common mode, an absolute value of a reflection coefficient for input ends of the second impedance-matching network is less than 0.4 at the specific frequency band.

DETAILED DESCRIPTION OF THE PREFERRED EMBODIMENTS

Figure 1:
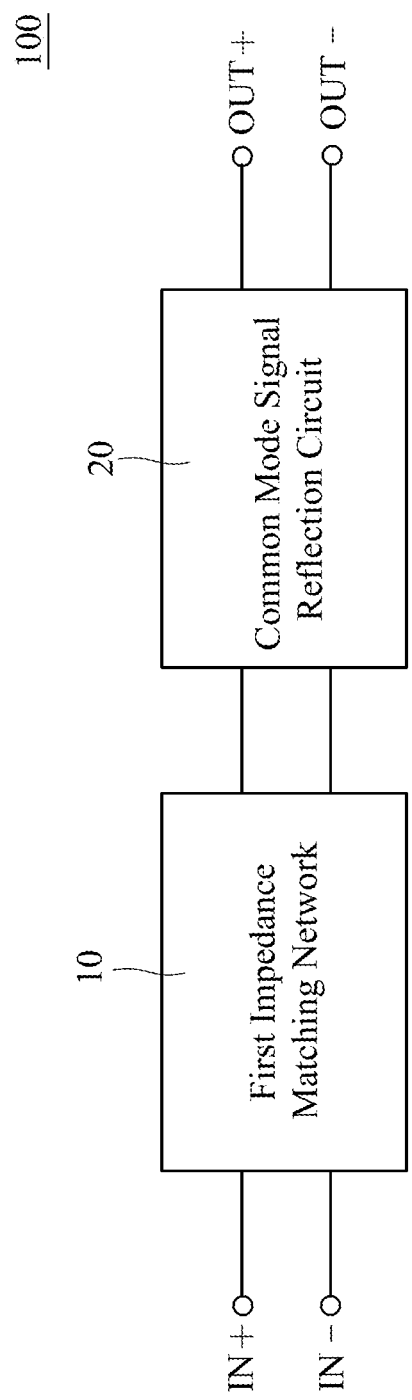
FIG. 1 is a diagram of circuit block of the common-mode signal absorber according to one embodiment of the present invention.

Referring to FIG. 1, there is shown a diagram of circuit block of the common-mode signal absorber according to one embodiment of the present invention. The common-mode signal absorber of the present invention is applied in the transmission of a differential-mode signal of a communication system. As shown in FIG. 1, the common-mode signal absorber 100 comprises a first impedance-matching network 10 and a common-mode signal reflection circuit 20. The first impedance-matching network 10 has a pair of input ends (IN+, IN−), and the common-mode signal reflection circuit 20 has a pair of output ends (OUT+, OUT−). A pair of input ends of the common-mode signal reflection circuit 20 are connected to a pair of output ends of the first impedance-matching network 10. A differential-mode signal is inputted into the input ends (IN+, IN−) of the first impedance-matching network 10, and outputted from the output ends (OUT+, OUT−) of the common-mode signal reflection circuit 20. A common-mode signal is often produced in the communication system due to some factors of non-ideal circuit structure. Therefore, the common-mode signal absorber 100 of the present invention will be used for suppressing the common-mode signal so as to avoid the common-mode signal to interfere the differential-mode signal transmitted on the communication system.

Figure 2:
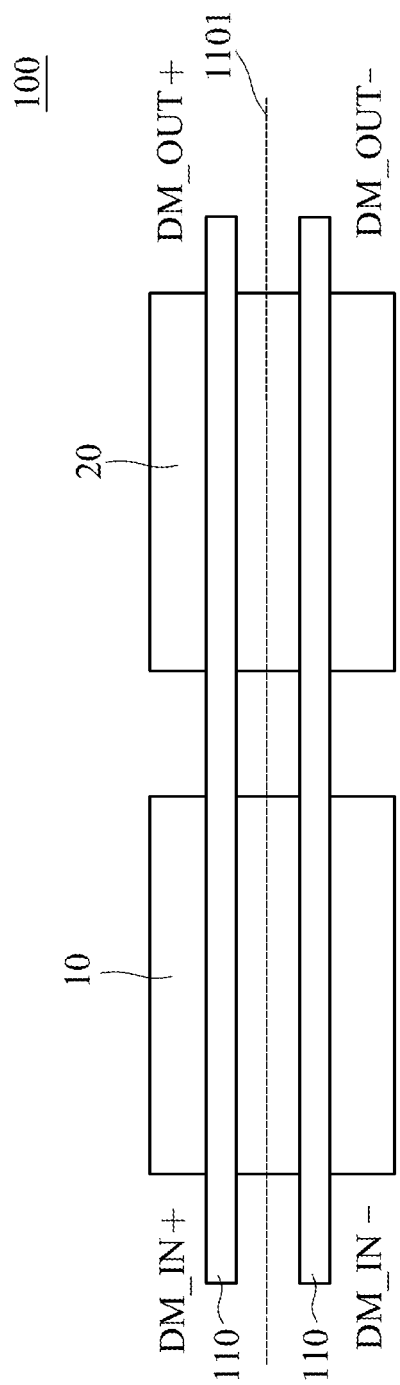
FIG. 2 is a diagram of circuit block of the common-mode signal absorber having a pair of differential transmission lines according to one embodiment of the present invention.

The common-mode signal absorber 100 of the present invention comprises two operation modes, for examples, a differential-mode and a common-mode. When the common-mode signal absorber 100 is operated in the differential mode, the differential-mode half circuits of the first impedance-matching circuit 10 and the common-mode signal reflection circuit 20 are all pass circuits or low pass circuits. The differential-mode signal is inputted into a pair of input ends (DM_IN) of the differential-mode half circuit of the first impedance-matching circuit 10, passed through the first impedance-matching circuit 10 and the common-mode signal reflection circuit 20, and outputted from a pair of output ends (DM_OUT) of the differential-mode half circuit of the common-mode signal reflection circuit 20. As shown in FIG. 2, the common-mode signal absorber 100 of the present invention further comprises a pair of differential transmission lines 110. The common-mode signal absorber 100 can transmit the differential-mode signal by the differential transmission lines 110. The circuit structure of the common-mode signal absorber 100 is symmetrically provided on right and left sides of a center line 1101 of the pair of differential transmission lines 110 so that the transmission paths of the differential-mode signal can be symmetrical. In the present invention, the differential transmission lines 110 are a pair of microstrip lines, a pair of slotted lines, a pair of artificial transmission lines, a pair of modified-T circuit lines, or other lines capable of transmitting signals.

In general, the transmission line is having two important features, such as characteristic impedance and electrical length. The artificial transmission line is a transmission line structure composed of a plurality of electronic components, which can realize the characteristic impedance and the electrical length desired by the general transmission line in the whole frequency band or the specific frequency band.

For example, the artificial transmission line is a low pass filter, which is composed of one capacitor and two inductors. Since the characteristic impedance and the electrical length of the transmission line are related to the inductance value and the capacitance value, the characteristic impedance and the electrical length desired by the general transmission line are obtained by adjusting the values of the capacitance and the two inductors of the low-pass filter. In the present embodiment, the artificial transmission line is a transmission line capable of operating at a low frequency.

Otherwise, the artificial transmission line is a modified-T circuit, which differs from the above low pass filter by adding a mutual capacitance (Cm), and generating a mutual inductance (Lm) between the two inductors. The characteristic impedance and the electrical length desired by the general transmission line are obtained by adjusting the values of the capacitance, the two inductors, the mutual capacitance, and the mutual inductance of the low-pass filter. Accordingly, the above described artificial transmission line is, but not limited to, a low-pass filter or a modified T-circuit.

Figure 3:
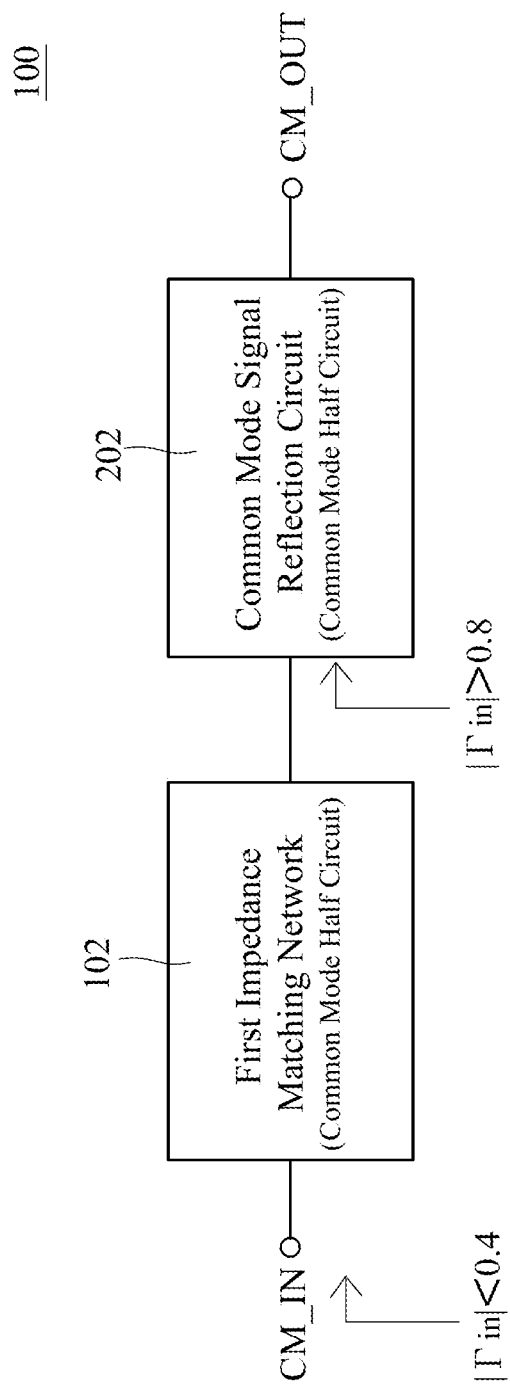
FIG. 3 is a diagram of circuit block of the common-mode signal absorber operated in a common mode according to one embodiment of the present invention.

As shown in FIG. 3, when the common-mode signal absorber 100 is operated in the common mode, the common-mode half circuit 202 of the common-mode signal reflection circuit 20 is a band stop circuit. For the common-mode signal within the specific frequency band, an absolute value of a reflection coefficient for the input end of the common-mode half circuit 202 of the common-mode signal reflection circuit 20 is designed to be greater than 0.8 ($|\Gamma_{in}|>0.8$) so that the common-mode signal reflection circuit 20 can reflect the common-mode signal within the specific frequency band.

In the circuit design of the present invention, the first impedance-matching circuit 10 is impedance matched to the common-mode signal within the specific frequency band. For the common-mode signal within the specific frequency band, an absolute value of a reflection coefficient for the input end of the common-mode half circuit 102 of the first impedance-matching circuit 10 is designed to be less than 0.4 ($|\Gamma_{in}|<0.4$) so that the first impedance-matching circuit 10 does not reflect the common-mode signal within the specific frequency band. Thus, When the common-mode signal is inputted into the first impedance-matching circuit 10, the first impedance-matching circuit 10 will absorb the common-mode signal within the specific frequency band by a lossy element (such as a first impedance unit 118 shown in FIG. 6). In other words, the energy of the common-mode signal within the specific frequency band will be dissipated by the lossy element configured in the first impedance-matching circuit 10.

Figure 4:
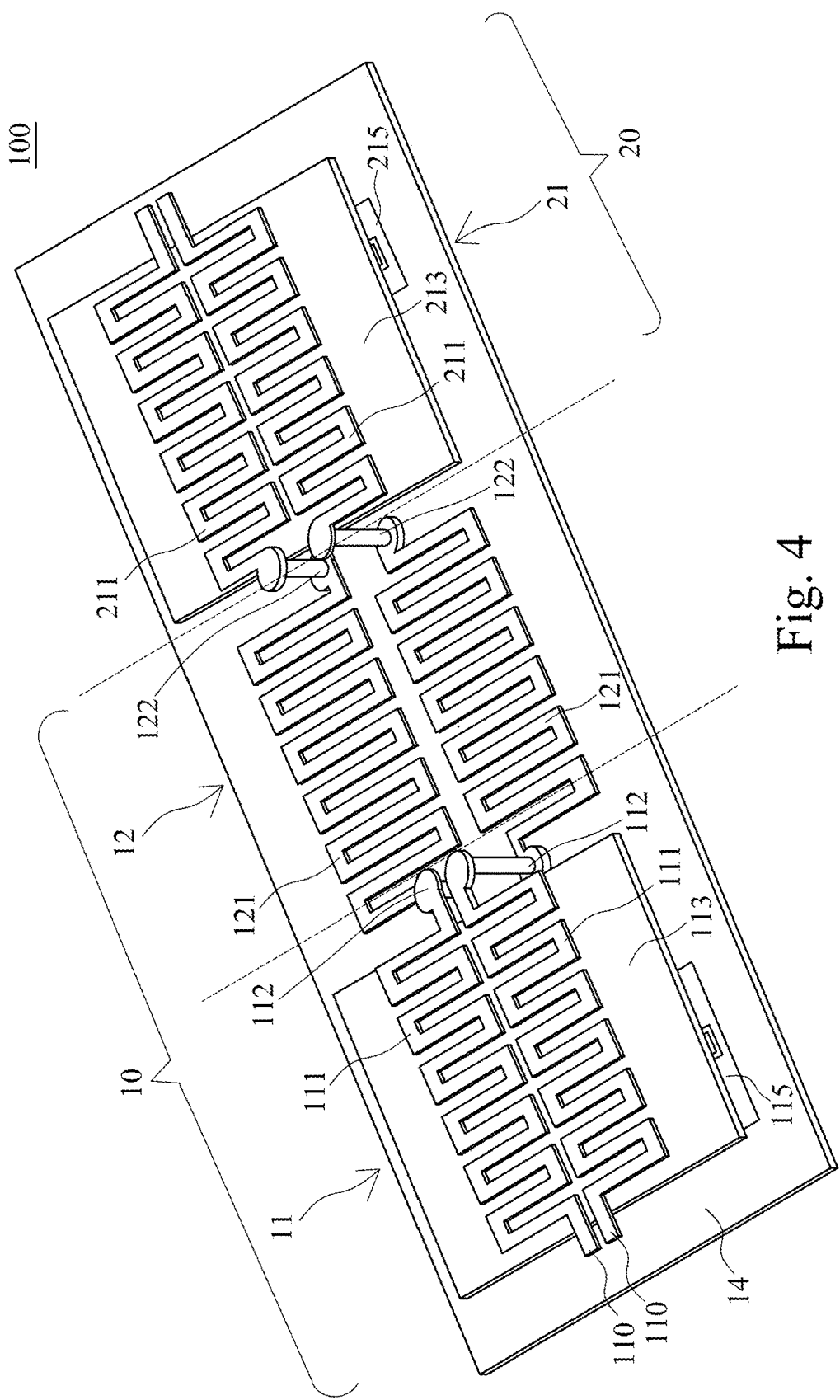
FIG. 4 is a three-dimensional structural view of the common-mode signal absorber according to one embodiment of the present invention.
Figure 5:
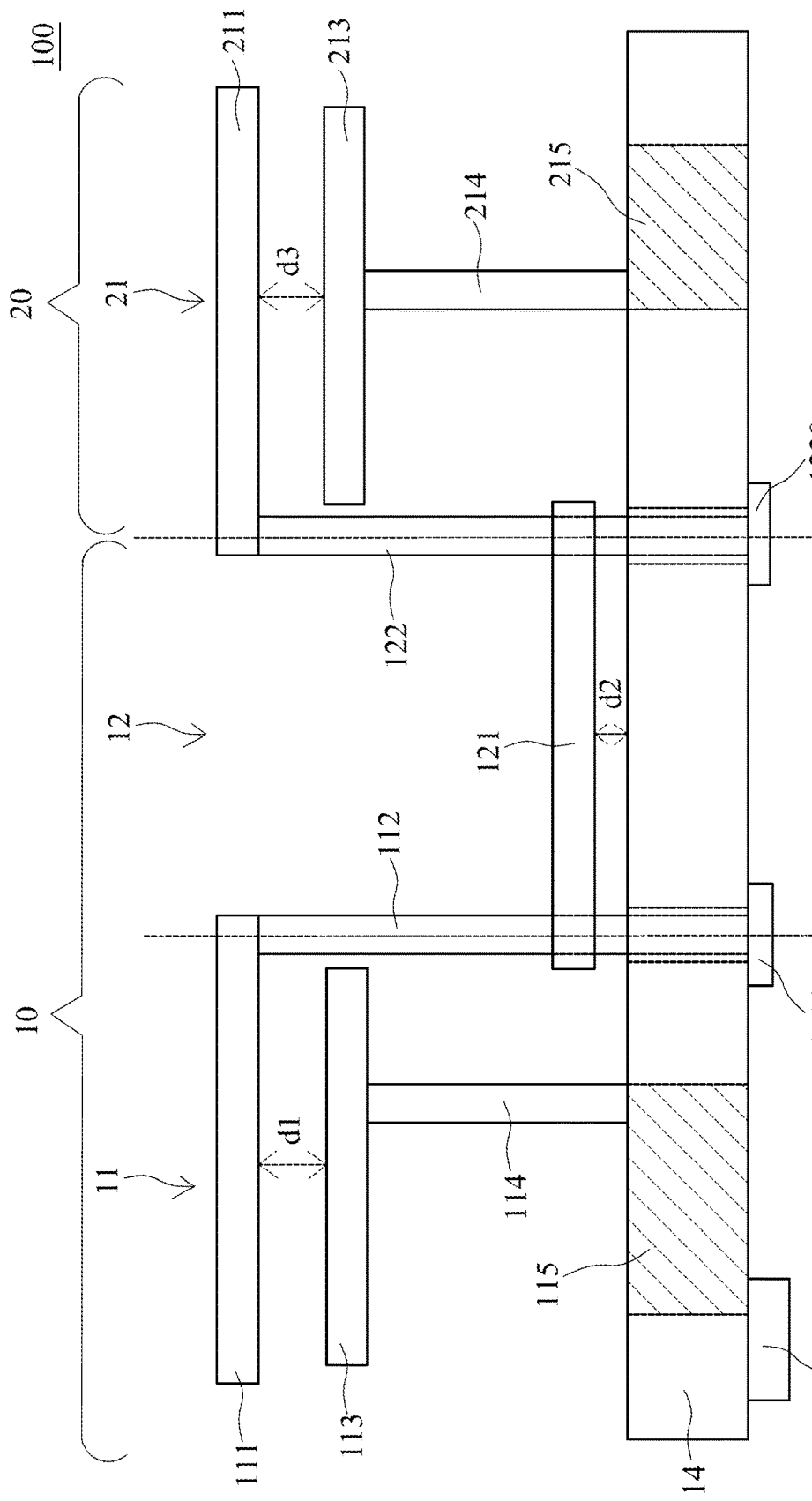
FIG. 5 is a structural cross-sectional view of the common-mode signal absorber according to one embodiment of the present invention.
Figure 6:
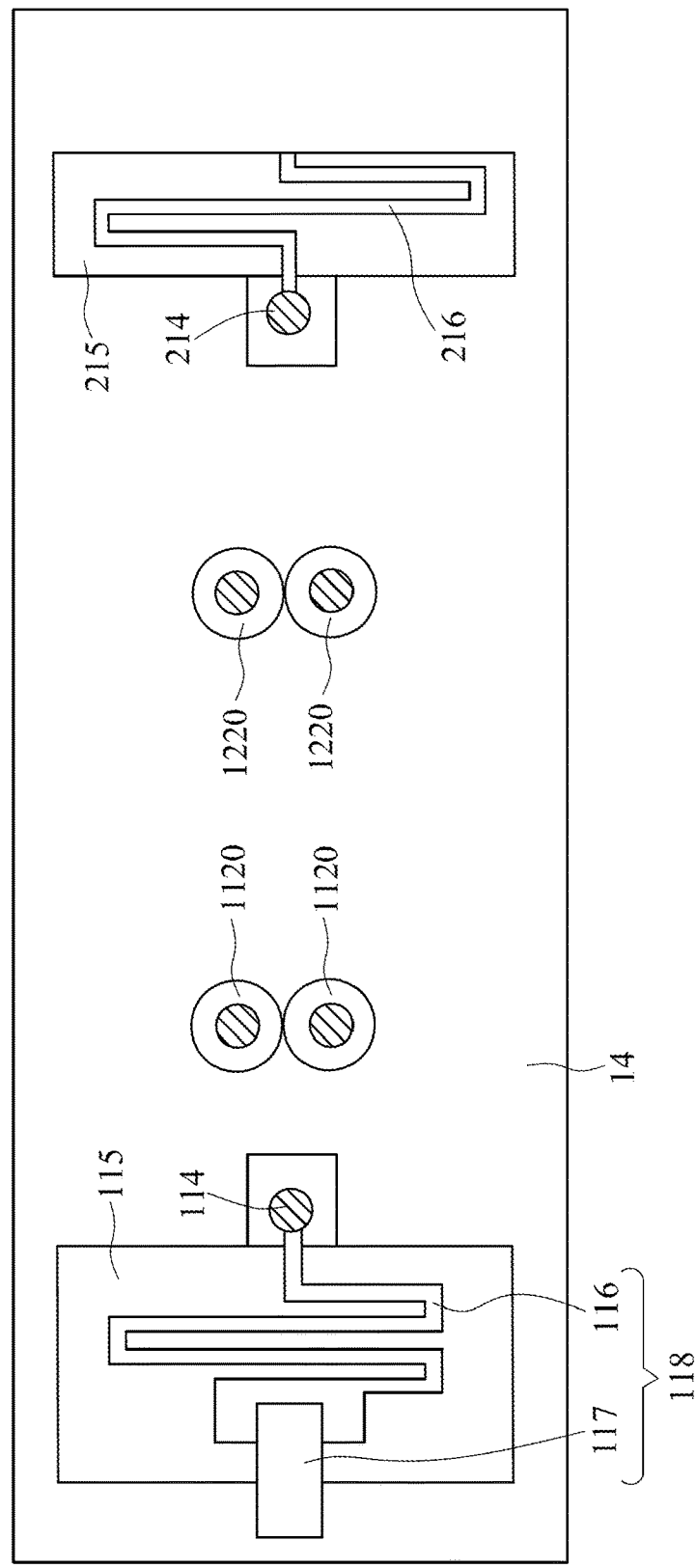
FIG. 6 is a structural bottom view of the common-mode signal absorber according to one embodiment of the present invention.

Referring to FIGS. 4, 5, and 6, there are shown a three-dimensional structural view, structural cross-sectional view, and structural bottom view of the common-mode signal absorber according to one embodiment of the present invention, and also referring to FIG. 1. As shown in FIGS. 1, 4, 5, and 6, the common-mode signal absorber 100 comprises a pair of differential transmission lines 110, a first metal pad 113, a second metal pad 213, and a ground layer 14.

Wherein the two differential transmission lines 110 are symmetrical to each other, and comprises a pair of first line segments 111, a pair of second line segments 121, and a pair of third line segments 211. In one embodiment of the present invention, the pair of first line segments 111, the pair of second line segments 121, or the pair of third line segments 211 are a pair of meandering lines symmetric to each other. The ground layer 14 is provided at one side thereof with a first slot portion 115, and provided at other side thereof with a second slot portion 215. A first impedance unit 118 is configured in the first slot portion 115, and a second impedance unit 216 is configured in the second slot portion 215. One end of the first impedance unit 118 is connected to the ground layer 14, one end of the second impedance unit 216 is connected to the ground layer 14. The first metal pad 113 is configured on the above of the first slot portion 115, and connected to other end of the first impedance unit 118 within the first slot portion 115 by a vertically configured first conductive via 114. The second metal pad 213 is configured on the above of the second slot portion 215, and connected to other end of the second impedance unit within the second slot portion 215 by a vertically configured second conductive via 214. In the present invention, the first impedance unit 118 or the second impedance unit 216 is a resistor, an inductor, a capacitor, a transmission line or a combination of the resistor, the inductor, the capacitor, and/or the transmission line in series or in parallel. For example, the first impedance unit 118 is a combination of an inductor 116 and a resistor 117 in series, and the second impedance unit 216 is an inductor. The above transmission line is a microstrip line, a slotted line, an artificial transmission line, a modified-T circuit line, or other line capable of transmitting signal. In one embodiment of the present invention, the impedance Z ($Z=R+jX$) for the first impedance unit 118, in which $R\neq0$, and $X\neq0$; the impedance Z ($Z=R+jX$) for the second impedance unit 216, in which $R\cong0$ and $X\neq0$.

Wherein the pair of first line segments 111 are provided at a position that is vertical extension of the first slot portion 115 and the first metal pad 113, and the pair of third line segments 211 are provided at a position that is vertical extension of the second slot portion 215 and the second metal pad 213. A gap (d1) is existed between the pair of first line segments 111 and the first metal pad 113. A gap (d2) is existed between the pair of third line segments 211 and the second metal pad 213. In one embodiment of the present invention, the gap (d1) is equal to the gap (d2). Furthermore, the pair of second line segments 121 are connected between the pair of first line segments 111 and the pair of third line segments 211, a gap (d2) is existed between the pair of second line segments 121 and the ground layer 14. Each of the second line segments 121 is connected at one end thereof to one end of each of the first line segments 111 by a vertically configured third conductive via 112, and connected at other end thereof to one end of each of the third line segments 211 by a vertically configured fourth conductive via 122. The third conductive via 112 and the fourth conductive via 122 will pass through the ground layer 14 to connect to an isolation pad 1220 configured on the bottom surface of the ground layer 14, respectively.

The pair of first line segments 111, the first metal pad 113, the first slot portion 115, the first impedance unit 118, and parts of the ground layer 14 around the first slot portion 115 will be formed as a first circuit structure 11. The pair of second line segments 121 and parts of the ground layer 14 below the second line segments 121 will be formed as a second circuit structure 12. The pair of third line segments 211, the second metal pad 213, the second slot portion 215, the second impedance unit 216, and parts of the ground layer 14 around the second slot portion 215 will be formed as a third circuit structure 21. In the present embodiment, the first impedance-matching network 10 comprises the first circuit structure 11 and the second circuit structure 12, and the common-mode signal reflection circuit 20 comprises the third circuit structure 21. The first circuit structure 11 of the first impedance-matching network 10 or the third circuit structure 21 of the common-mode signal reflection circuit 20 will be implemented by a three-dimensional mushroom structure.

Figure 7:
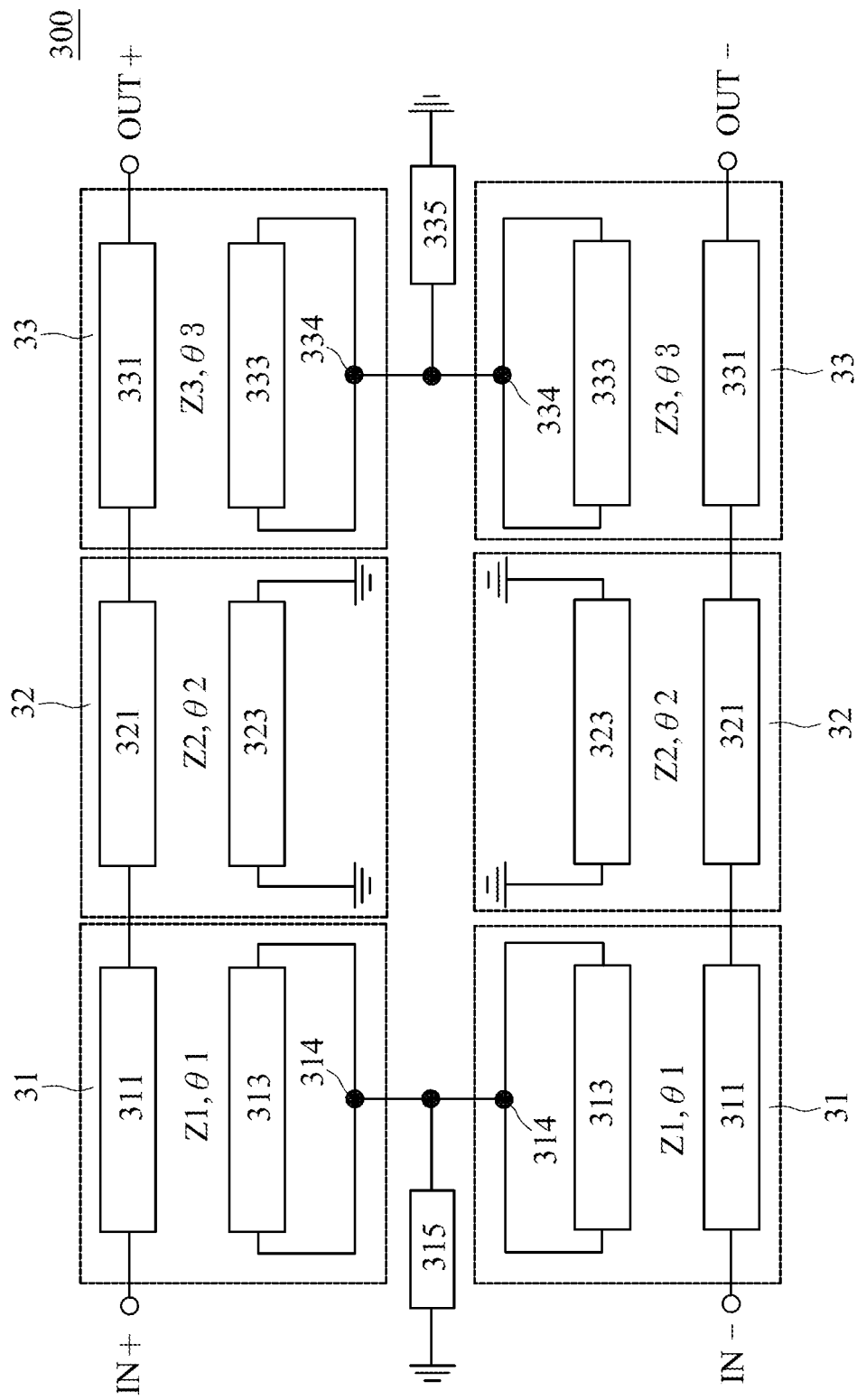
FIG. 7 is a diagram of circuit structure of an equivalent circuit of the common-mode signal absorber according to one embodiment of the present invention.

Referring to FIG. 7 is a diagram of circuit structure of an equivalent circuit of the common-mode signal absorber according to one embodiment of the present invention, and also referring to FIGS. 4, 5, and 6. The equivalent circuit 300 of the common-mode signal absorber 100 comprises a pair of first equivalent transmission line models 31, a pair of second equivalent transmission line models 32, and a pair of third equivalent transmission line models 33. The first line segments 111 of the differential transmission lines 110 are coupled to the first metal pad 113 to generate the first equivalent transmission line models 31. The second line segments 121 of the differential transmission lines 110 are coupled to the ground layer 14 to generate the second equivalent transmission line models 32. The third line segments 211 of the differential transmission lines 110 are coupled to the third metal pad 213 to generate the third equivalent transmission line models 33.

Each of the first equivalent transmission line models 31 comprises a first master transmission conductor 311 and a first slave transmission conductor 313, respectively. The first master transmission conductor 311 is represented as the equivalent element of the first line segment 111, while the first slave transmission conductor 313 is represented as the equivalent element of the first metal pad 113. Each of the second equivalent transmission line models 32 comprises a second master transmission conductor 321 and a second slave transmission conductor 323. The second master transmission conductor 321 is represented as the equivalent element of the second line segment 121, while the second slave transmission conductor 323 is represented as the equivalent element of the ground layer 14. Each of the third equivalent transmission line models 33 comprises a third master transmission conductor 331 and a third slave transmission conductor 333. The third master transmission conductor 331 is represented as the equivalent element of the third line segment 211, while the third slave transmission conductor 333 is represented as the equivalent element of the second metal pad 213. A first impedance equivalent element 315 is represented as the equivalent element of the first impedance unit 118, while a second impedance equivalent element 335 is represented as the equivalent element of the second impedance unit 216.

In each of the first equivalent transmission line models 31, the first master transmission conductor 311 is connected at one port thereof to a signal input end (IN+/IN−), while the first slave transmission conductor 313 is connected at left and right ports thereof to a first node 314. In each of the second equivalent transmission line models 32, the second master transmission conductor 321 is connected at one port thereof to other port of the first master transmission conductor 311, while the second slave transmission conductor 323 connected at left and right ports thereof to ground, respectively. In each of the third equivalent transmission line models 33, the third master transmission conductor 331 is connected at one port thereof to other port of the second master transmission conductor 321 and connected at other port thereof to a signal output end (OUT+/OUT−), while the third slave transmission conductor 323 is connected at left and right ports thereof to a second node 334. Furthermore, the two first nodes 314 of the two first equivalent transmission line models 31 are connected together and connected to ground by the first impedance equivalent element 315, and the two second nodes 334 of the two third equivalent transmission line models 33 are connected together and connected to ground by the second impedance equivalent element 335. The equivalent circuit 300 of the common-mode signal absorber 100 of the present invention is a configuration of fully symmetrical equivalent circuit.

In the present embodiment, the first equivalent transmission line model 31 is represented as the equivalent circuit of the first circuit structure 11, the second equivalent transmission line model 32 is represented as the equivalent circuit of the second circuit structure 12, and the third equivalent transmission line model 33 is represented as the equivalent circuit of the third circuit structure 21. The combination of the first equivalent transmission line model 31 and the second equivalent transmission line model 32 is represented as the equivalent circuit of the first impedance-matching network 10 shown in FIGS. 1, 4, and 5, while the third equivalent transmission line model 33 is represented as the equivalent circuit of the common-mode signal reflection circuit 20 shown in FIGS. 1, 4, and 5.

Figure 8:
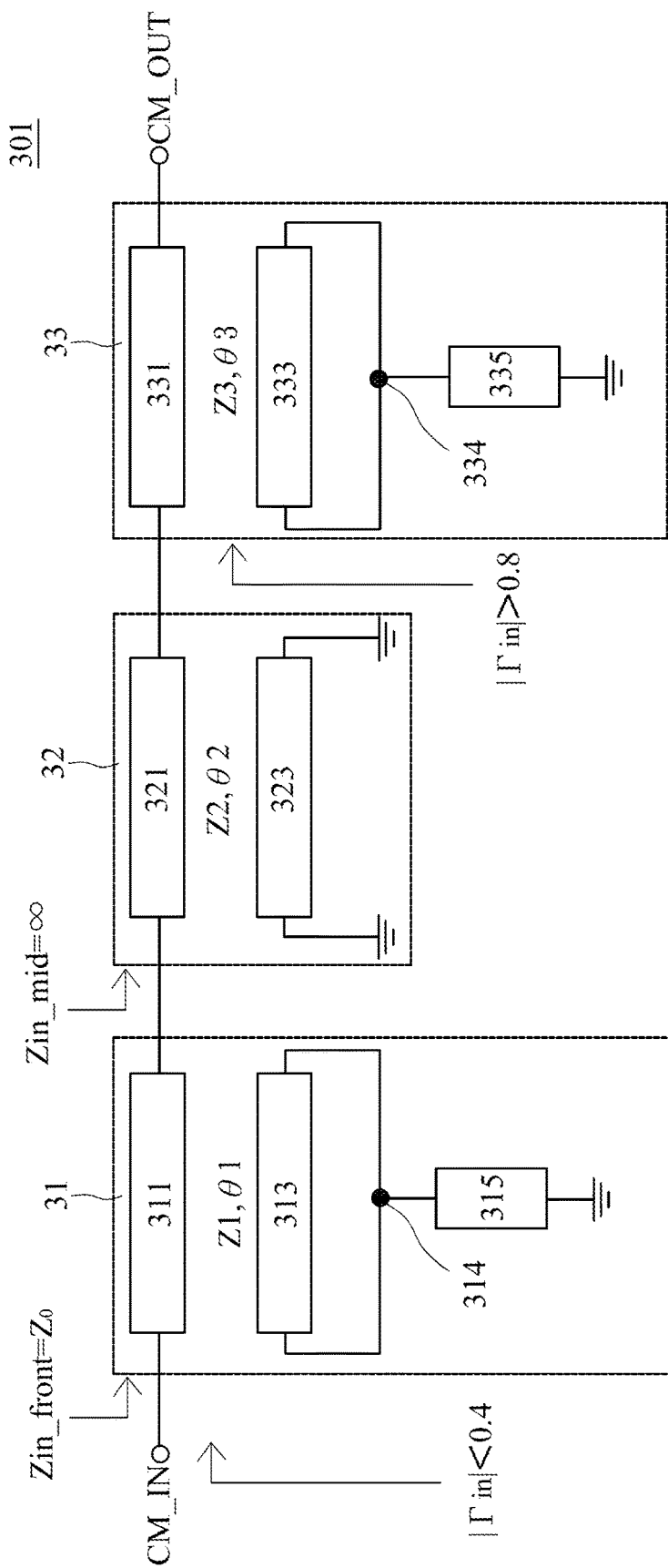
FIG. 8 is a diagram of circuit structure of a common-mode equivalent half circuit of the common-mode signal absorber according to one embodiment of the present invention.

Continually, referring to FIG. 8 is a diagram of circuit structure of a common-mode equivalent half circuit of the common-mode signal absorber according to one embodiment of the present invention. The equivalent circuit 300 of the common-mode signal absorber 100 is divided into a differential-mode equivalent half circuit or a common-mode equivalent half circuit 301 according to the operation mode thereof. The differential-mode equivalent half circuit of the common-mode signal absorber 100 is an all pass circuit or low pass circuit having two ports, and the circuit configuration of the common-mode equivalent half circuit 301 of the common-mode signal absorber 100 is disclosed in FIG. 8. As shown in FIG. 8, the common-mode equivalent half circuit 301 comprises the first equivalent transmission line model 31, the second equivalent transmission line model 32, and the third equivalent transmission line model 33. In the first equivalent transmission line model 31, a first characteristic impedance Z1 and a first electrical length θ1 are coupling generated between the first master transmission conductor 311 and the first slave transmission conductor 313. In the second equivalent transmission line model 32, a second characteristic impedance Z2 and a second electrical length θ2 are coupling generated between the second master transmission conductor 321 and the second slave transmission conductor 323. In the third equivalent transmission line model 33, a third characteristic impedance Z3 and a third electrical length θ3 are coupling generated between the third master transmission conductor 331 and the third slave transmission conductor 333. In the present invention, the first characteristic impedance Z1, the second characteristic impedance Z2, and the third characteristic impedance Z3 are of the same impedance value or the different impedance value, while the first electrical length θ1, the second electrical length θ2, and the third electrical length θ3 are of the same electrical length or the different electrical length. In one embodiment of the present invention, the second electrical length θ2 is approached to a zero value.

In the present embodiment, the specific frequency band of the common-mode signal to be absorbed can be decided by the adjustment of impedance values of the second impedance equivalent element 335 and the third electrical length θ3 of the third equivalent transmission line model 33. Accordingly, for the common-mode signal within the specific frequency band, an absolute value of a reflection coefficient for input end of the third equivalent transmission line model 33 is greater than 0.8 ($|\Gamma_{in}|>0.8$) so that the common-mode signal within the specific frequency band will be reflected by the third equivalent transmission line model 33, and an absolute value of a reflection coefficient for input end of the first equivalent transmission line model 31 is less than 0.4 ($|\Gamma_{in}|<0.4$) so that the common-mode signal within the specific frequency band will be not reflected by the first equivalent transmission line model 31.

Wherein the input impedance of the third equivalent transmission line model 33 is approached to zero value. The input impedance is able to be impedance transformed from zero to infinity ($0 \to \infty$) by the second equivalent transmission line model 32. Therefore, the input impedance ($Z_{IN\_mid}$) of the input end of the second equivalent transmission line model 32 is approached to a infinity value, in such a way that the third equivalent transmission line model 33 will be equivalent approach to an open circuit, and therefore the common-mode signal within the specific frequency band may be reflected by the third equivalent transmission line model 33. In the first equivalent transmission line model 31, the input impedance ($Z_{IN\_front}$) of the common-mode signal input end (CM_IN) can be transformed into the system impedance value ($Z_0$) by the adjustment of impedance values of the first impedance equivalent element 315 and the first electrical length θ1 so that the first equivalent transmission line model 31 can be impedance matched to the common-mode signal the specific frequency band. Thus, when the common-mode signal within the specific frequency band enters the first equivalent transmission line model 31, it can be absorbed by the first impedance equivalent element 315.

Figure 9:
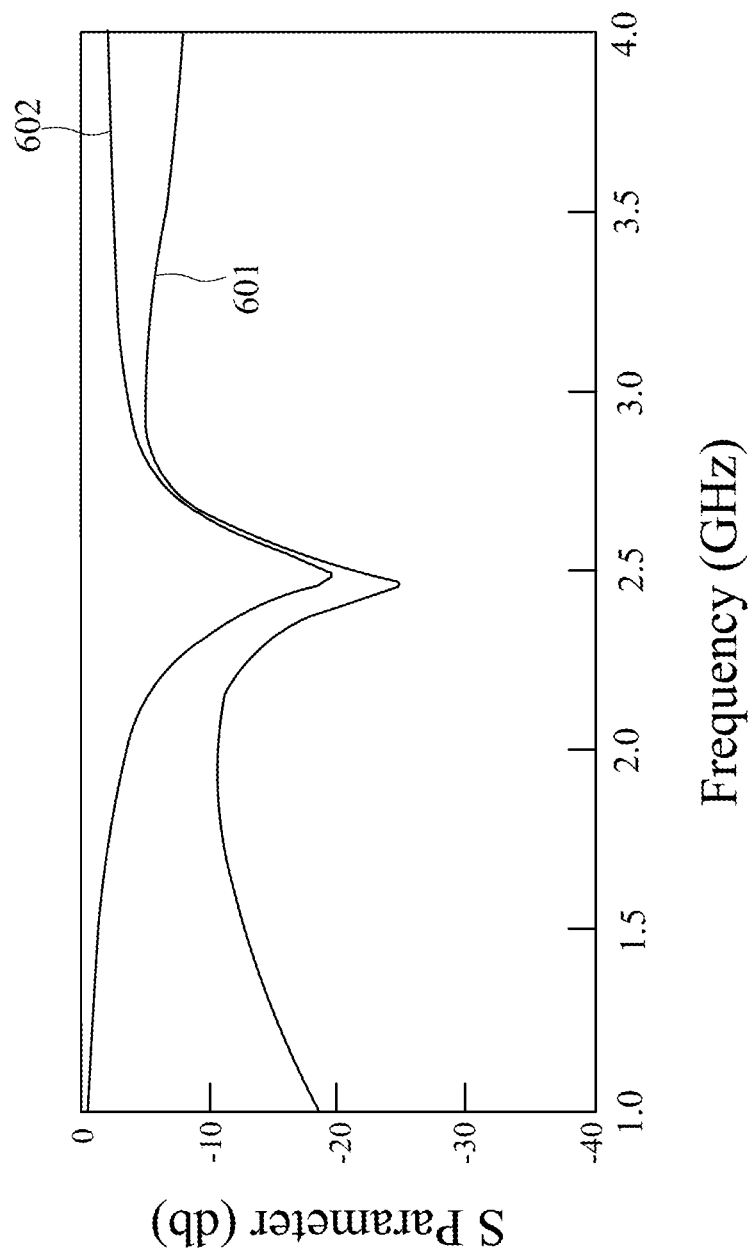
FIG. 9 is an oscillogram obtained by proceeding the measurement of the common-mode signal with respect to the common-mode signal absorber.

Referring to FIG. 9, there is shown an oscillogram obtained by proceeding the measurement of the common-mode signal with respect to the common-mode signal absorber. As shown in FIG. 9, a common-mode reflection loss $|S_{CC}11|$ curve 601 and a common-mode insertion loss $|S_{CC}21|$ curve 602 are obtained by the measurement of the common-mode signal in the practical application of the common-mode signal absorber 100. In the case of common-mode signal, it is generally to use −10 dB as the basis for reflection loss $|S_{CC}11|$ and insertion loss $|Scc21|$ of the common-mode signal. When a reflection loss $|S_{CC}11|$ and an insertion loss $|Scc21|$ of the common-mode signal is below −10 dB, it indicates that the common-mode signal is absorbed effectively. Taking the present invention as an example, the reflection loss $|S_{CC}11|$ on the curve 601 within the frequency band between 2 GHz and 2.7 GHz is situated below −10 dB, while the insertion loss $|Scc21|$ on the curve 602 within the frequency band between 2.3 GHz and 2.7 GHz is situated below −10 dB.

Figure 10:
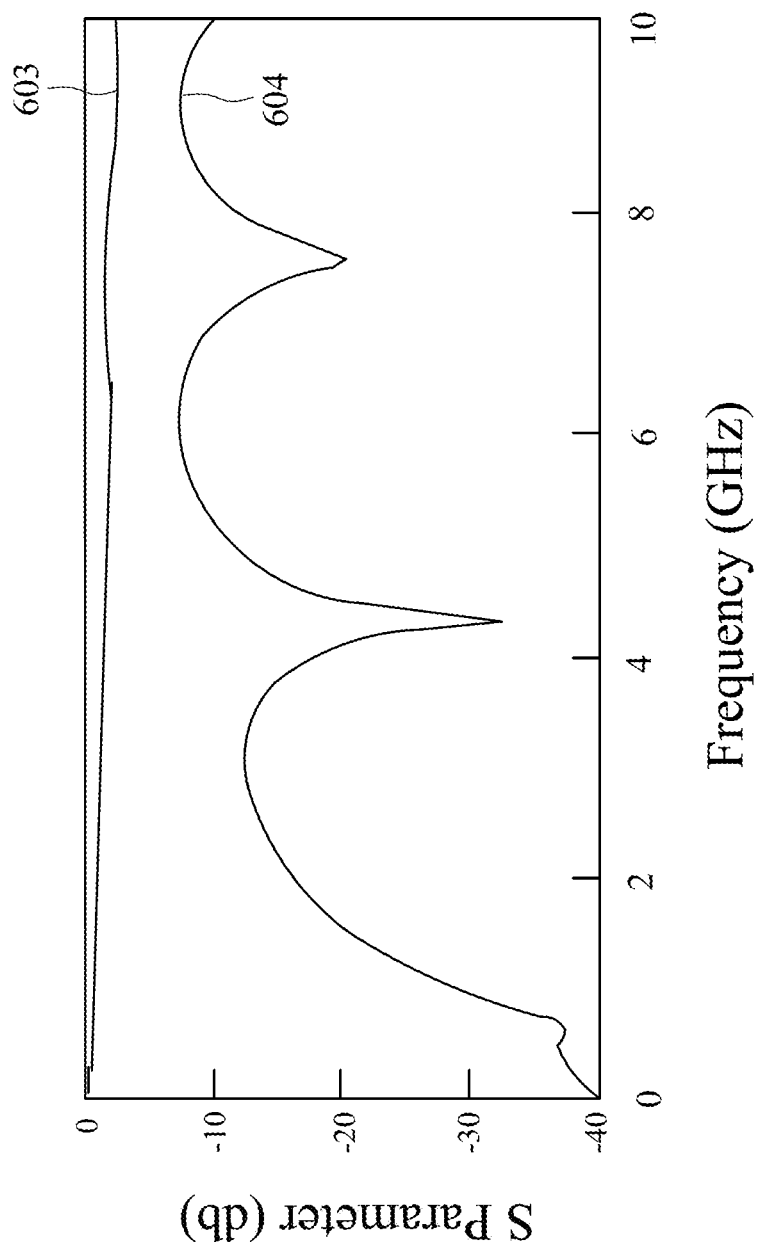
FIG. 10 is an oscillogram obtained by proceeding the measurement of the differential-mode signal with respect to the common-mode signal absorber.

Referring to FIG. 10, there is shown an oscillogram obtained by proceeding the measurement of the differential-mode signal with respect to the common-mode signal absorber. As shown in FIG. 10, a differential-mode insertion loss $|S_{dd}21|$ curve 603 and a differential-mode reflection loss $|S_{dd}11|$ curve 604 are obtained by the measurement of the differential-mode signal in the practical application of the common-mode signal absorber 100. It is known from the curve 603, the differential-mode insertion loss $|S_{dd}21|$ is always approached to 0 dB when the differential-mode signal is transmitted in any frequency range, signal decay may be not occurred significantly in transmission of differential-mode signal. Besides, it is known from the curve 604, the differential-mode reflection loss $|S_{dd}11|$ is always lower than −10 dB when the differential-mode signal is transmitted in any frequency range, the reflection loss of the differential-mode signal is kept at a lower value. Thus, the differential-mode signal transmitted on the common-mode signal absorber 100 is able to obtain a better quality of transmission.

Figure 11:
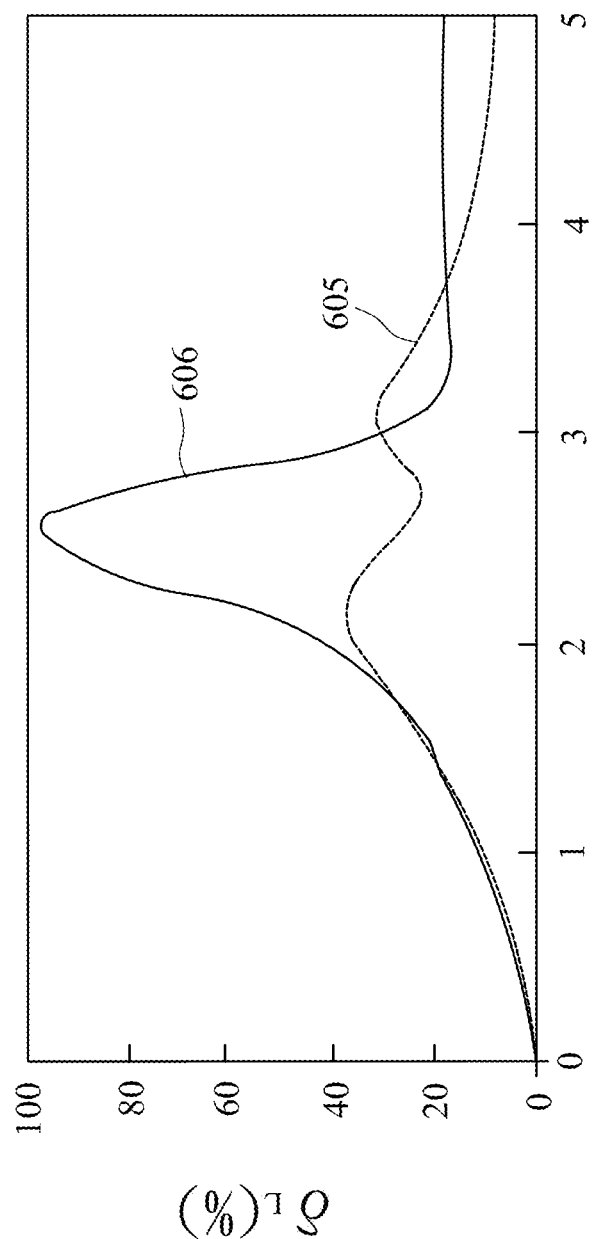
FIG. 11 is an absorption rate oscillogram with respect to the convention common-mode signal absorber without the impedance-matching circuit, and the common-mode signal absorber provided with the impedance-matching circuit of the present invention.

Referring to FIG. 11, there is shown an absorption rate oscillogram with respect to the convention common-mode signal absorber without the impedance-matching circuit, and the common-mode signal absorber provided with the impedance-matching circuit of the present invention. As shown in FIG. 11, the curve 605 represents the absorption rate with respect to the convention common-mode signal absorber without the impedance-matching circuit, and the curve 606 represents the absorption rate with respect to the common-mode signal absorber provided with the impedance-matching circuit of the present invention. Wherein the absorption rate (X) is defined as $X=1-|A|^2-|B|^2$, A is the reflection coefficient of the common-mode signal absorber, and B is the transmission coefficient of the common-mode signal absorber.

It is known from the curve 605, the absorption rate of the convention common-mode signal absorber without the impedance-matching circuit is all below 40% when the convention common-mode signal absorber without the impedance-matching circuit is operated at any frequency band, the differential-mode signal is easy interfered by the common-mode signal.

It is known from the curve 606, the absorption rate of the common-mode signal absorber provided with the impedance-matching circuit of the present invention may be more than 50% when the common-mode signal absorber provided with the impedance-matching circuit of the present invention is operated at frequency band 2.2-2.8 GHz, it means that when the common-mode signal absorber 100 of the present invention is operated at the frequency band 2.2 to 2.8 GHz.

Figure 12:
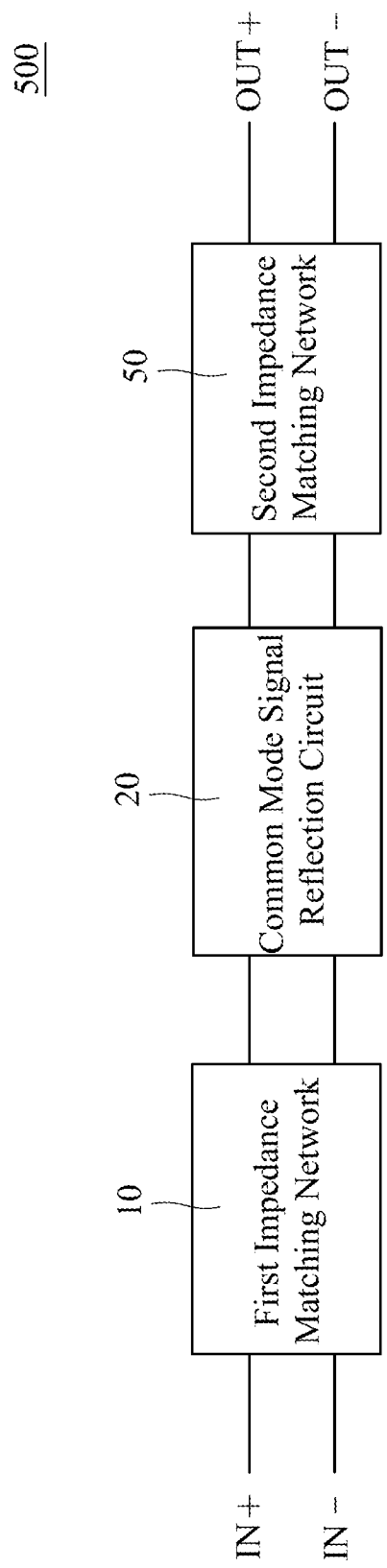
FIG. 12 is a diagram of circuit block of the common-mode signal absorber according to another embodiment of the present invention.

Referring to FIG. 12, there is shown a diagram of circuit block of the common-mode signal absorber according to another embodiment of the present invention. As shown in FIG. 12, the common-mode signal absorber 500 further comprises a second impedance-matching network 50. The input ends of the second impedance-matching network 50 are connected to the output ends of the common-mode signal reflection circuit 20. The differential-mode signal is inputted from the input ends of the first impedance-matching network 10, and outputted from the output ends of the second impedance-matching network 50. For the common-mode signal within the specific frequency band, an absolute value of a reflection coefficient for the input ends of the second impedance-matching network 50 is designed to be less than 0.4 ($|\Gamma_{in}|<0.4$) so that the second impedance-matching circuit 50 is not reflecting the common-mode signal within the specific frequency band. The second impedance-matching network 50 is provided inside thereof with a lossy element (such as a second impedance unit). The second impedance-matching network 50 is impedance matched to the common-mode signal at specific frequency band. When the common-mode signal within the specific frequency band is inputted into the second impedance-matching circuit 50, the second impedance-matching circuit 50 will absorb the common-mode signal within the specific frequency band by the use of the second impedance unit. Thus, the first impedance-matching network 10 and the second impedance-matching network 50 are configured on the input ends and the output ends of the common-mode signal reflection circuit 20, respectively, so as to achieve the effect of bidirectional absorption of the common-mode signal.

Summed up the above description, the common-mode signal absorber 100 may be used for absorbing the common-mode signal within the specific frequency band by the impedance-matching circuit 10/50 so as to avoid the common-mode signal reflected, by the common-mode signal reflection circuit 20, to other radiating elements and therefore to interfere signals transmitted on the communication system.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

What is claimed is:

1. A common-mode signal absorber, comprising:
a first impedance-matching network comprising a first impedance unit; and
a common-mode signal reflection circuit, wherein input ends of the common-mode signal reflection circuit are connected to output ends of the first impedance-matching network, a differential-mode signal is inputted from input ends of the first impedance-matching network, and outputted from output ends of the common-mode signal reflection circuit;
wherein the first impedance-matching network is impedance matched to a common-mode signal within a specific frequency band; when the common-mode signal within the specific frequency band inputs to the first impedance-matching network from the input ends of the first impedance-matching network, the first impedance unit of the first impedance-matching network can be used for absorbing the common-mode signal within the specific frequency band; when the common-mode signal within the specific frequency band is unabsorbed by the first impedance unit and inputs to the common-mode signal reflection circuit through the first impedance-matching network, the common-mode signal within the specific frequency band will be reflected by the common-mode signal reflection circuit back to the first impedance-matching network so that the first impedance unit of the first impedance-matching network can absorb the common-mode signal reflected by the common-mode signal reflection circuit;
wherein the common-mode signal within the specific frequency band is able to be repeatedly absorbed and reflected between the first impedance-matching network and the common-mode signal reflection circuit until an energy of the common-mode signal within the specific frequency band is completely exhausted.

2. The common-mode signal absorber according to claim 1, with regard to the common-mode signal within the specific frequency band, an absolute value of a reflection coefficient for the input ends of the common-mode signal reflection circuit is greater than 0.8, an absolute value of a reflection coefficient for the input ends of the first impedance-matching network is less than 0.4.

3. The common-mode signal absorber according to claim 1, wherein the common-mode signal absorber has an absorption rate above 50% for the common-mode signal within the specific frequency band.

4. The common-mode signal absorber according to claim 1, wherein the common-mode signal absorber further comprises a pair of differential transmission lines, the common-mode signal absorber transmits the differential-mode signal by the pair of differential transmission lines, a circuit structure of the common-mode signal absorber is symmetrically provided on right and left sides of the differential transmission lines based on a center line between the pair of differential transmission lines.

5. The common-mode signal absorber according to claim 1, wherein a circuit structure of the common-mode signal absorber comprises:
a ground layer, provided on one side thereof with a first slot portion, and provided on other side thereof with a second slot portion, wherein a first impedance unit is configured in the first slot portion, a second impedance unit is configured in the second slot portion, one end of the first impedance unit is connected to the ground layer, one end of the second impedance unit is connected to the ground layer;
a first metal pad, configured on the above of the first slot portion, and connected to other end of the first impedance unit by a vertically configured first conductive via;
a second metal pad, configured on the above of the second slot portion, and connected to other end of the second impedance unit by a vertically configured second conductive via; and
a pair of differential transmission lines comprising a pair of first line segments, a pair of second line segments, and a pair of third line segments, wherein the pair of first line segments are provided at a position that is vertical extension of the first slot portion and the first metal pad, the pair of third line segments are provided at a position that is vertical extension of the second slot portion and the second metal pad, a gap is existed between the pair of first line segments and the first metal pad, and between the pair of third line segments and the second metal pad, respectively, the pair of second line segments are connected between the pair of first line segments and the pair of third line segments, other gap is existed between the pair of second line segments and the ground layer, one ends of the pair of second line segments are connected to one ends of the pair of first line segments by a vertically configured third conductive via, respectively, other ends of the pair of second line segments are connected to one ends of the pair of third line segments by a vertically configured fourth conductive via, respectively;

wherein the pair of first line segments, the first metal pad, the first slot portion, the first impedance unit, and parts of the ground layer around the first slot portion will be formed as a first circuit structure, the pair of second line segments and parts of the ground layer below the pair of second line segments will be formed as a second circuit structure, the pair of third line segments, the second metal pad, the second slot portion, the second impedance unit, and parts of the ground layer around the second slot portion will be formed as a third circuit structure, the first impedance-matching network comprises the first circuit structure and the second circuit structure, the common-mode signal reflection circuit comprises the third circuit structure.

6. The common-mode signal absorber according to claim 5, wherein the pair of first line segments, the pair of second line segments, or the pair of third line segments are a pair of symmetrical line segments.

7. The common-mode signal absorber according to claim 5, wherein the common-mode signal absorber further comprises a second impedance-matching network, the second impedance-matching network is connected to the common-mode signal reflection circuit, the differential-mode signal is inputted into the first impedance-matching network, passed through the common-mode signal reflection circuit, and outputted from the second impedance-matching network, the second impedance-matching network comprises a second impedance unit, the second impedance-matching network is impedance matched to the common-mode signal within the specific frequency band, the second impedance unit of the second impedance-matching network is used to absorb the common-mode signal within the specific frequency band when the common-mode signal within the specific frequency band enters the second impedance-matching network.

8. The common-mode signal absorber according to claim 7, with regard to the common-mode signal within the specific frequency band, an absolute value of a reflection coefficient for the input ends of the second impedance-matching network is less than 0.4.

* * * * *